United States Patent
Lorenz (10) Patent No.: US 7,095,229 B2
(45) Date of Patent: Aug. 22, 2006

(54) MULTICOIL IMAGE ANALYSIS FOR MAGNETIC RESONANCE IMAGE SEGMENTATION, REGISTRATION, AND RECONSTRUCTION

(75) Inventor: Christine H. Lorenz, Frederick, MD (US)

(73) Assignee: Siemens Corporate Research Inc., Princeton, NJ (US)

( * ) Notice: Subject to any disclaimer, the term of this patent is extended or adjusted under 35 U.S.C. 154(b) by 0 days.

(21) Appl. No.: 11/036,457

(22) Filed: Jan. 14, 2005

(65) Prior Publication Data

US 2005/0156594 A1 Jul. 21, 2005

Related U.S. Application Data

(60) Provisional application No. 60/538,042, filed on Jan. 20, 2004.

(51) Int. Cl.
*G01V 3/00* (2006.01)
(52) U.S. Cl. .................................. 324/309; 324/307
(58) Field of Classification Search ................ 324/318, 324/322, 319, 309, 307, 300; 600/410, 422
See application file for complete search history.

(56) References Cited

U.S. PATENT DOCUMENTS

| | | | |
|---|---|---|---|
| 6,344,745 B1 * | 2/2002 | Reisker et al. | 324/318 |
| 6,396,269 B1 * | 5/2002 | Hajnal et al. | 324/307 |
| 6,549,799 B1 * | 4/2003 | Bock et al. | 600/422 |
| 6,771,071 B1 * | 8/2004 | Wright et al. | 324/318 |
| 6,831,460 B1 * | 12/2004 | Reisker et al. | 324/318 |
| 6,940,282 B1 * | 9/2005 | Dumoulin et al. | 324/318 |

* cited by examiner

*Primary Examiner*—Brij B. Shrivastav (57) ABSTRACT

A system and corresponding method for multicoil image analysis are provided, the system including a processor, an imaging adapter in signal communication with the processor for receiving image data from each of a plurality of individual coils, an analysis unit in signal communication with the processor for analyzing the individual coil image data, and a reconstruction unit in signal communication with the processor for reconstructing a composite image or coil images from the individual coil image data; and the method including receiving image data from each of a plurality of individual coils, analyzing the individual coil image data, and reconstructing a composite image or coil images from the individual coil image data.

20 Claims, 10 Drawing Sheets

MULTICOIL IMAGE ANALYSIS FOR MAGNETIC RESONANCE IMAGE SEGMENTATION, REGISTRATION, AND RECONSTRUCTION

CROSS-REFERENCE TO RELATED APPLICATION

This application claims the benefit of U.S. Provisional Application Ser. No. 60/538,042, filed Jan. 20, 2004 and entitled "Multicoil Image Analysis for Magnetic Resonance Image Segmentation, Registration, and Reconstruction", which is incorporated herein by reference in its entirety.

BACKGROUND

Medical image scanning data, for example, is typically obtained in the form of slices in various types of imaging modalities. These slices are then stacked to form a three-dimensional (3D) volume.

In the case of cardiovascular applications, for example, image registration and segmentation is often difficult in magnetic resonance (MR) imaging due to a lack of contrast between features, and/or due to artifacts in the images. This problem is compounded when fast imaging methods are used at the price of the signal-to-noise ratio (SNR).

Existing approaches to image registration and segmentation work with varying degrees of success, and some are dependent on a priori knowledge of the structure under investigation. Accordingly, it is desirable in many cardiovascular applications to have an automatic, accurate and robust technique for image registration and segmentation, particularly where an organ is in motion.

SUMMARY

These and other drawbacks and disadvantages of the prior art are addressed by a system and method of multicoil image analysis for magnetic resonance image segmentation, registration, and reconstruction.

A system for multicoil image analysis includes a processor, an imaging adapter in signal communication with the processor for receiving image data from each of a plurality of individual coils, an analysis unit in signal communication with the processor for analyzing the individual coil image data, and a reconstruction unit in signal communication with the processor for reconstructing a composite image or individual coil images from the individual coil image data.

A corresponding method for multicoil image analysis includes receiving image data from each of a plurality of individual coils, analyzing the individual coil image data, and reconstructing a composite image or individual coil images from the individual coil image data.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches a system and method of multicoil image analysis for magnetic resonance image segmentation, registration, and reconstruction, in accordance with the following exemplary figures, in which.

DETAILED DESCRIPTION OF PREFERRED EMBODIMENTS

Image registration and segmentation is often difficult in magnetic resonance (MR) imaging, for example, due to at least a lack of contrast between features and/or artifacts in the images. This problem may be compounded when fast imaging methods are used to the detriment of the signal-to-noise ratio (SNR). An exemplary embodiment of the present disclosure adds information for segmentation by acquiring images with slightly different contrasts and combining the image information to identify tissues. The embodiment uses individual images from local radio frequency (RF) coils to glean differences in contrast for the purposes of segmentation, registration, coil selection, and/or reconstruction. A composite image reconstructed from the individual RF coils may also be used for further refinement of segmentation or registration, and is amenable to inline processing.

Figure 1:
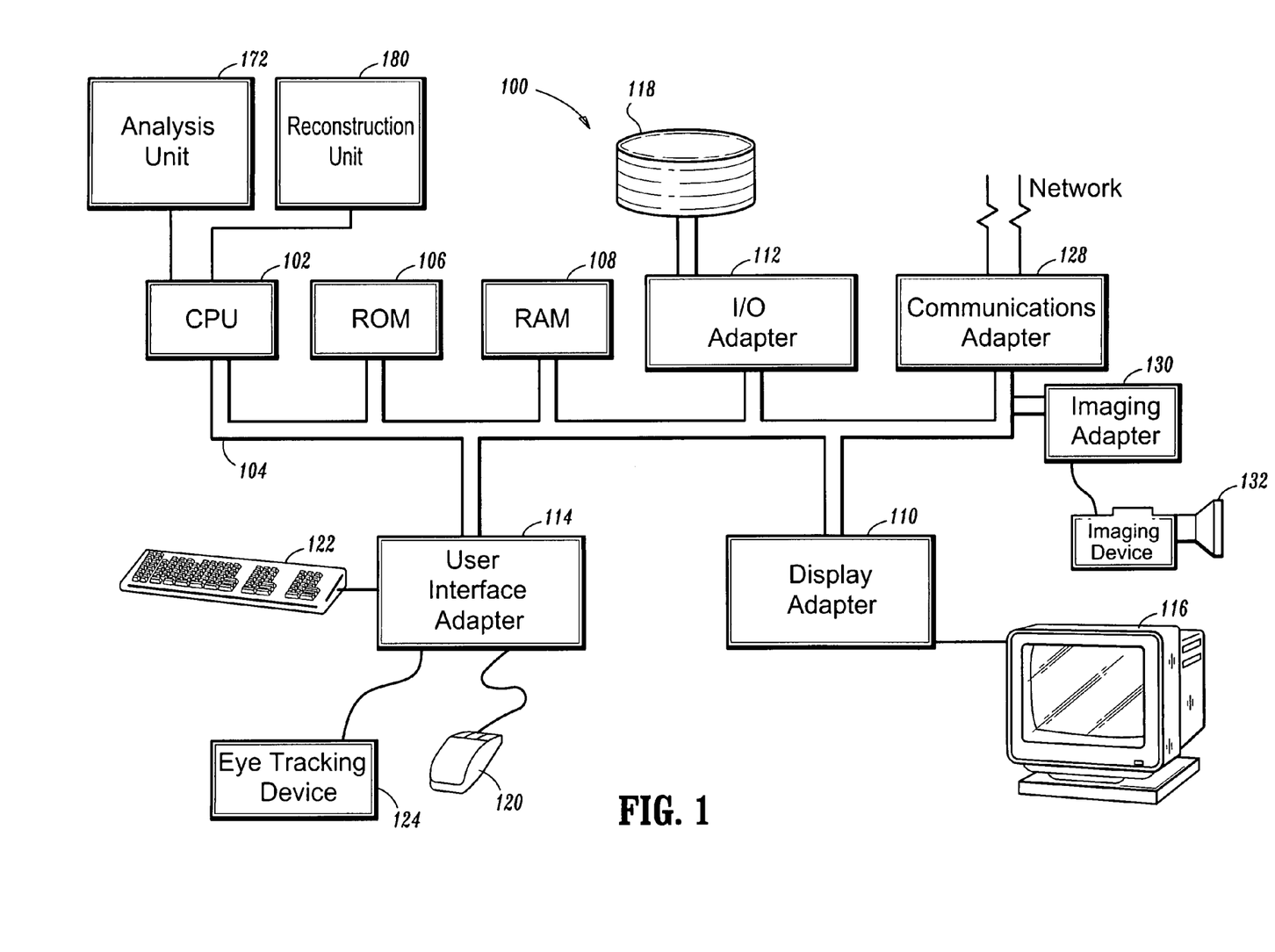
FIG. 1 shows a schematic diagram of a system for multicoil image analysis in accordance with an illustrative embodiment of the present disclosure.

As shown in FIG. 1, a system for multicoil image analysis for magnetic resonance image segmentation, registration, and reconstruction, according to an illustrative embodiment of the present disclosure, is indicated generally by the reference numeral 100. The system 100 includes at least one processor or central processing unit (CPU) 102 in signal communication with a system bus 104. A read only memory (ROM) 106, a random access memory (RAM) 108, a display adapter 110, an I/O adapter 112, a user interface adapter 114, a communications adapter 128, and an imaging adapter 130 are also in signal communication with the system bus 104. A display unit 116 is in signal communication with the system bus 104 via the display adapter 110. A disk storage unit 118, such as, for example, a magnetic or optical disk storage unit is in signal communication with the system bus 104 via the I/O adapter 112. A mouse 120, a keyboard 122, and an eye tracking device 124 are in signal communication with the system bus 104 via the user interface adapter 114. A magnetic resonance imaging device 132 is in signal communication with the system bus 104 via the imaging adapter 130.

An image analysis unit 172 and an image reconstruction unit 180 are also included in the system 100 and in signal communication with the CPU 102 and the system bus 104. While the image analysis unit 172 and the image reconstruction unit 180 are illustrated as coupled to the at least one processor or CPU 102, these components are preferably embodied in computer program code stored in at least one of the memories 106, 108 and 118, wherein the computer program code is executed by the CPU 102. As will be recognized by those of ordinary skill in the pertinent art based on the teachings herein, alternate embodiments are possible, such as, for example, embodying some or all of the computer program code in registers located on the processor chip 102. Given the teachings of the disclosure provided herein, those of ordinary skill in the pertinent art will contemplate various alternate configurations and implementations of the image analysis unit 172 and the image reconstruction unit 180, as well as the other elements of the system 100, while practicing within the scope and spirit of the present disclosure.

Figure 2:
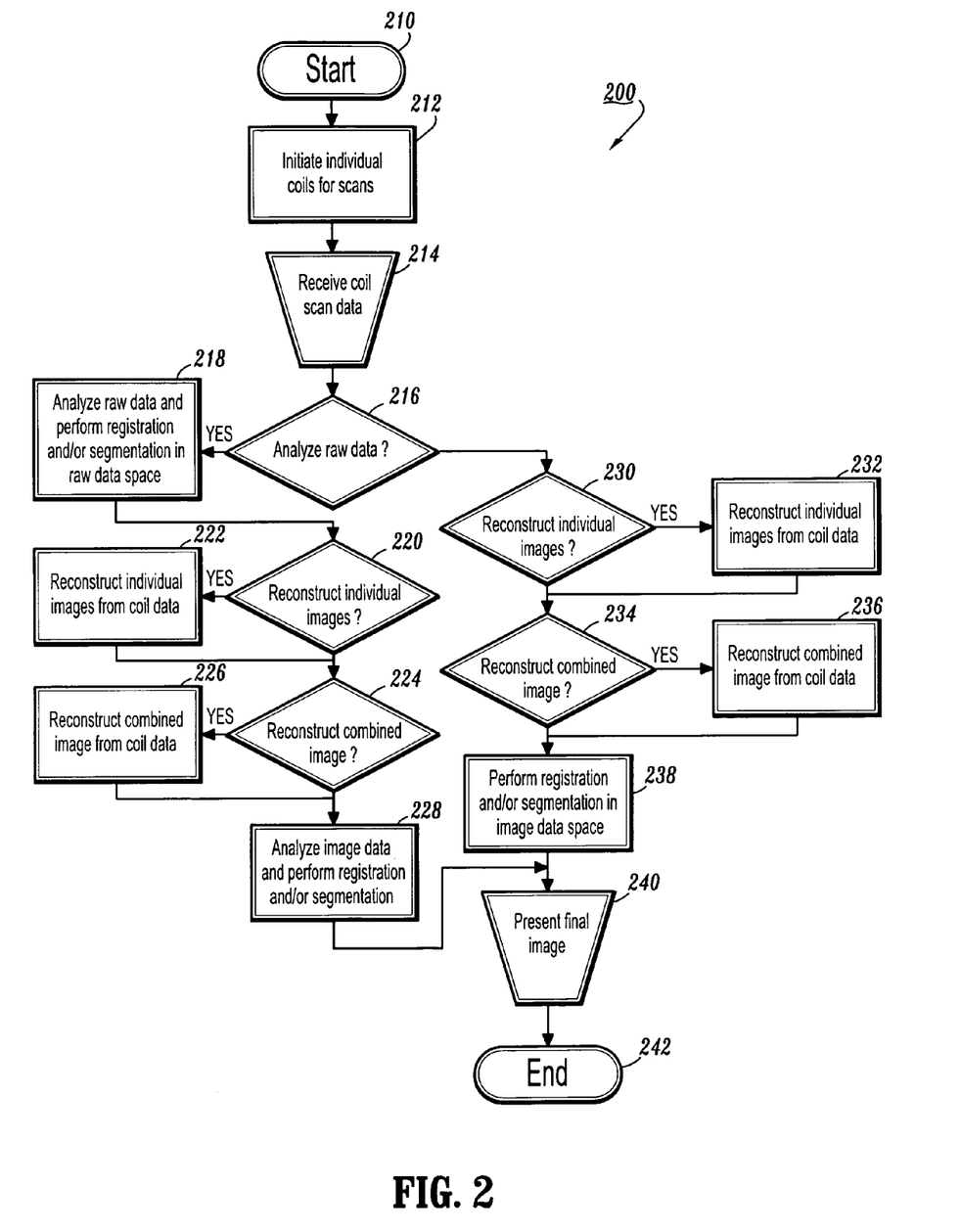
FIG. 2 shows a flow diagram of a method for multicoil image analysis in accordance with an illustrative embodiment of the present disclosure.

Turning to FIG. 2, a flowchart for multicoil image analysis for magnetic resonance image segmentation, registration, and reconstruction, according to an illustrative embodiment of the present disclosure, is indicated generally by the reference numeral 200. The flowchart 200 includes a start block 210 that passes control to a function block 212. The function block 212 initiates individual coils for scanning and passes control to an input block 214. The input block 214 receives individual coil scan data and passes control to a decision block 216.

The decision block 216 checks whether to analyze the raw coil data, and if so, passes control to a function block 218. The function block 218 analyzes the individual coil image data, such as by profiling intensities, for example, and performs registration and/or segmentation in the raw data space. The block 218 passes control to a decision block 220. The decision block 220 checks whether to reconstruct individual coil images, and if so, passes control to a function block 222. If not, the block 220 passes control to a block 224. The function block 222 performs reconstruction of individual coil images from the coil data, and passes control to the decision block 224. The decision block 224 checks whether to reconstruct a combined composite image, and if so, passes control to a function block 226. If not, the block 224 passes control to a block 228. The function block 226 performs reconstruction of a composite image from the individual coil image data, and passes control to the function block 228. The function block 228 analyzes the image data and performs registration and/or segmentation responsive to the analysis, and passes control to an output block 240.

If, on the other hand, the decision block 216 determines not to analyze the raw coil data, it passes control to a decision block 230 to check whether to reconstruct individual coil images. If not, the block 230 passes control to a block 234, and if so, the block 230 passes control to a function block 232 to reconstruct individual images from the coil data. The block 232 passes control to the decision block 234 to check whether to reconstruct a combined image, and if so, passes control to a function block 236 to reconstruct the combined image from the coil data. If not, the block 234 passes control to a block 238. The block 236 passes control to the function block 238. The block 238 performs registration and/or segmentation in the image data space, and passes control to the output block 240.

The output block 240, in turn, presents the final image, and passes control to an end block 242. One or more of the function blocks 218, 228 and 238 may use the analyzed coil image data and/or profiled coil image intensities to supplement the information contained in the composite image.

Figure 3:
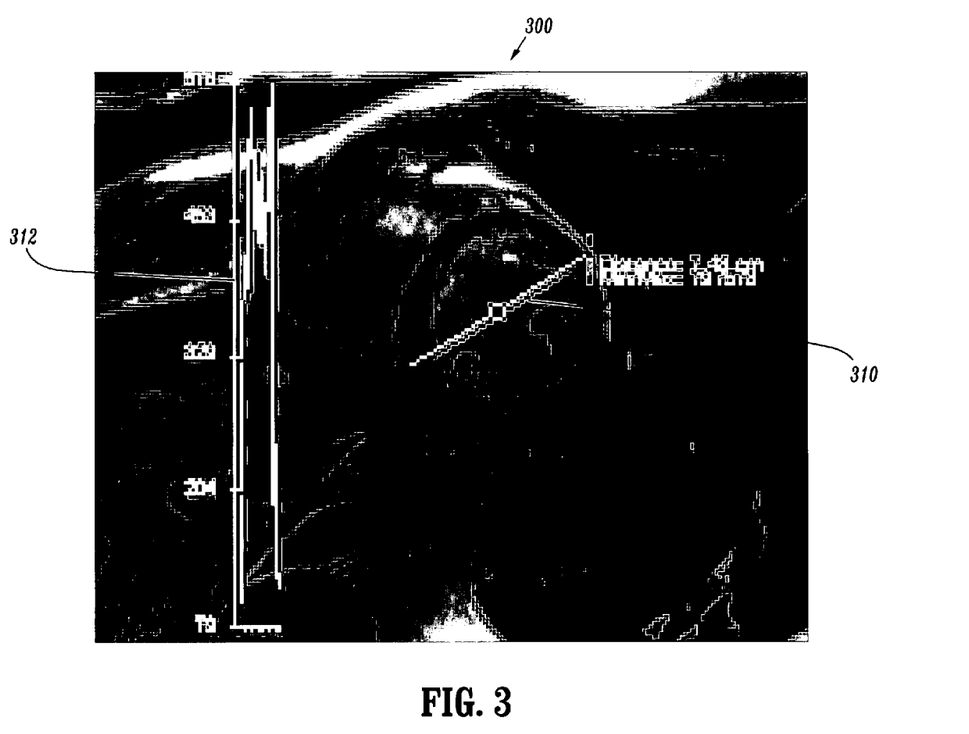
FIG. 3 shows a graphical diagram of an individual surface coil image of relatively high contrast in accordance with an illustrative embodiment of the present disclosure.

Turning now to FIG. 3, an individual image of high contrast constructed from a small surface coil is indicated generally by the reference numeral 300. The image 300 includes an intensity path 310, here having a length of about 7.48 centimeters, which has an intensity profile 312 that is displayed here over the image merely for descriptive purposes. The instant intensity profile 312 has a range of about 79 to about 578.

Figure 4:
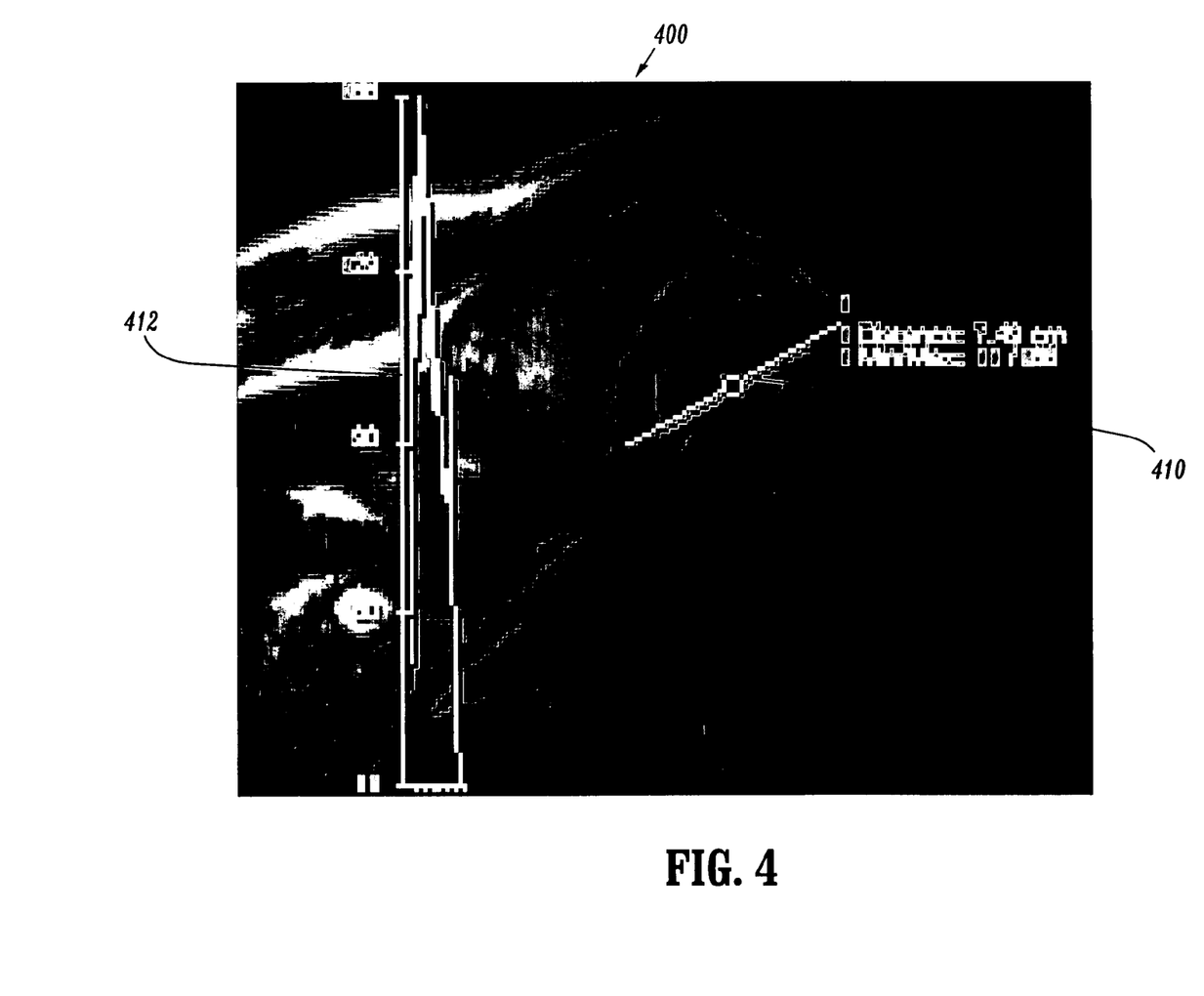
FIG. 4 shows a graphical diagram of an individual surface coil image in accordance with an illustrative embodiment of the present disclosure.

As shown in FIG. 4, an individual image constructed from a small surface coil is indicated generally by the reference numeral 400. The image 400 includes an intensity path 410, here having a length of about 7.49 centimeters, which has an intensity profile 412 that is displayed here over the image merely for descriptive purposes. The instant intensity profile 412 has a range of about 11 to about 168.

Figure 5:
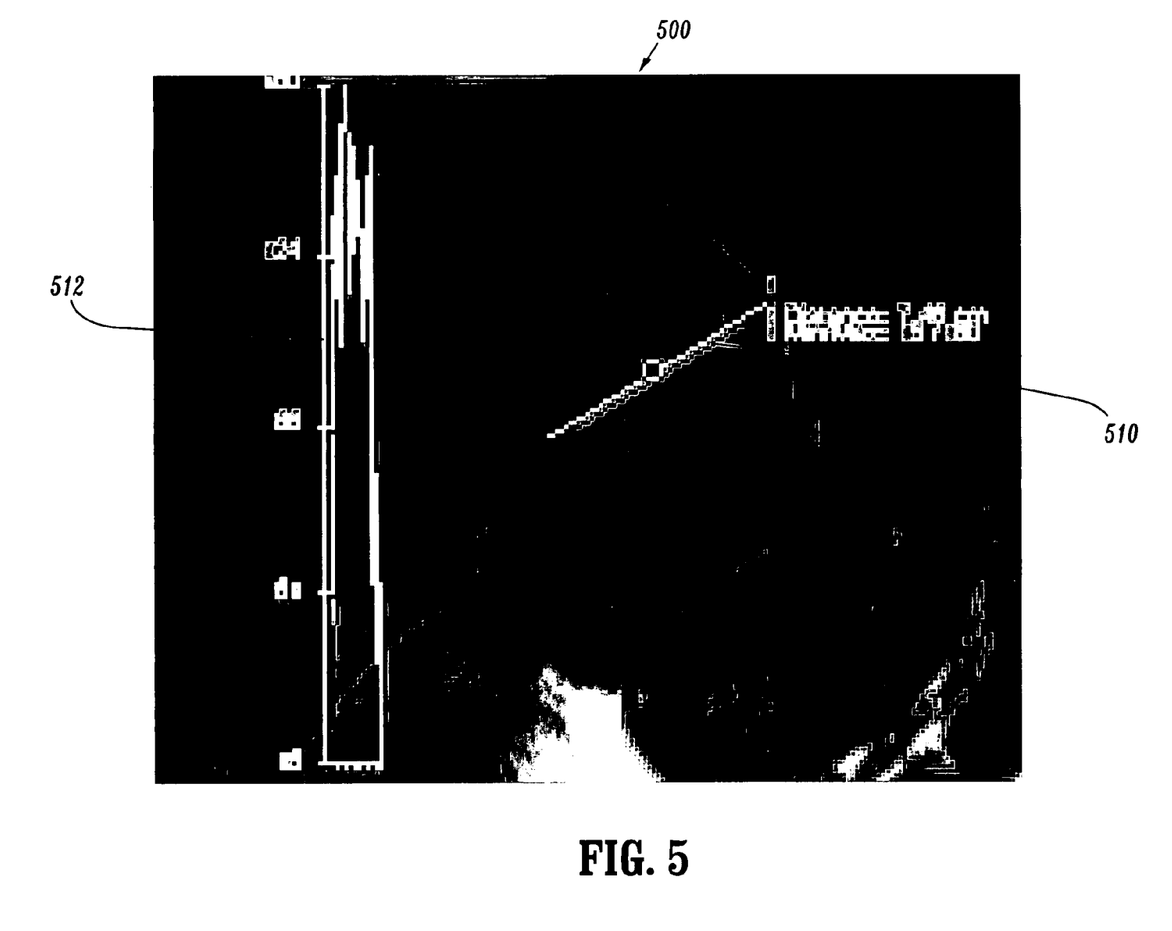
FIG. 5 shows a graphical diagram of an individual surface coil image in accordance with an illustrative embodiment of the present disclosure.

Turning to FIG. 5, an individual image constructed from a small surface coil is indicated generally by the reference numeral 500. The image 500 includes an intensity path 510, here having a length of about 7.48 centimeters, which has an intensity profile 512 that is displayed here over the image merely for descriptive purposes. The instant intensity profile 512 has a range of about 15 to about 160.

Figure 6:
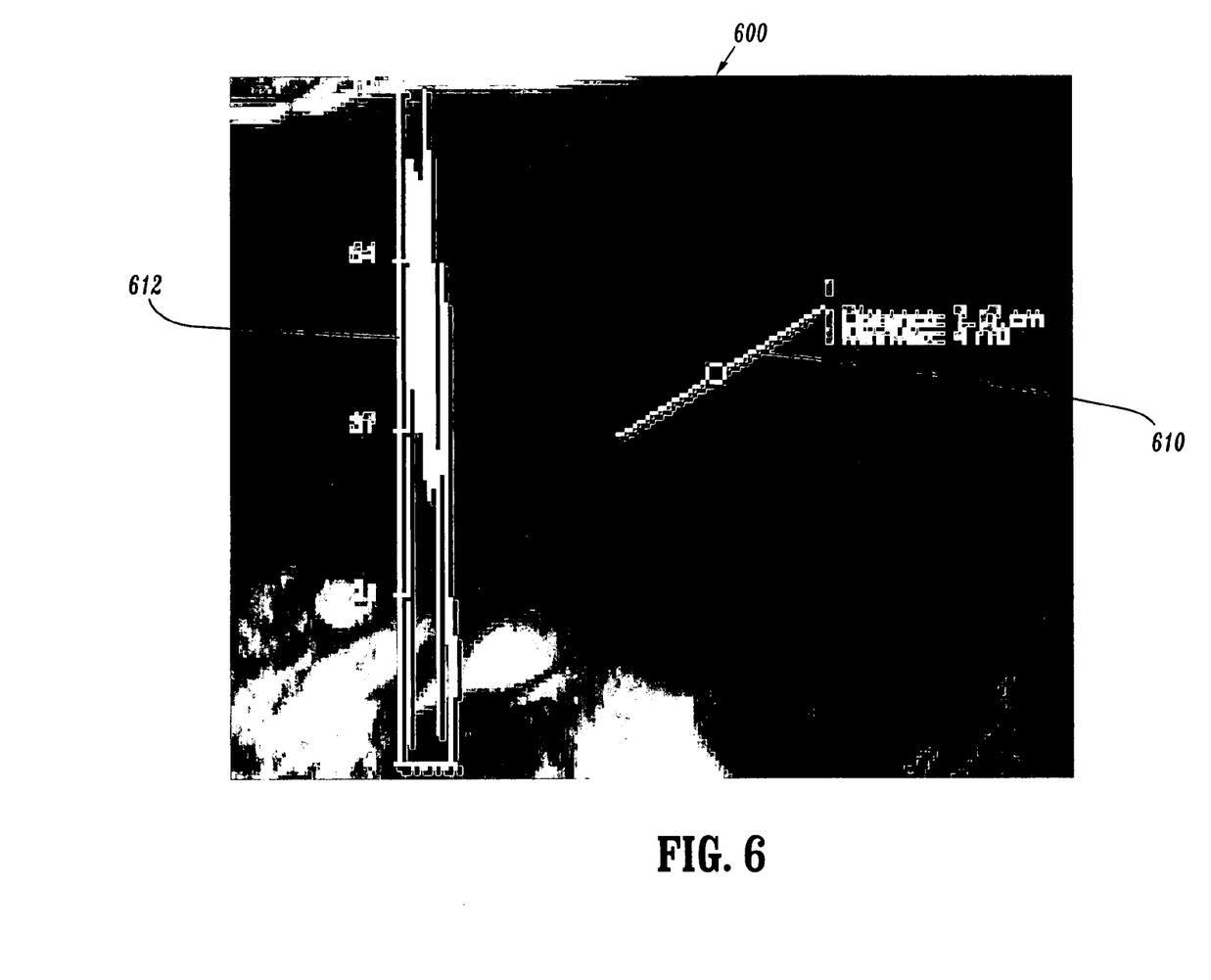
FIG. 6 shows a graphical diagram of an individual surface coil image of relatively low contrast in accordance with an illustrative embodiment of the present disclosure.

Turning now to FIG. 6, an individual image of rather low contrast constructed from a small surface coil is indicated generally by the reference numeral 600. The image 600 includes an intensity path 610, here having a length of about 7.37 centimeters, which has an intensity profile 612 that is displayed here over the image merely for descriptive purposes. The instant intensity profile 612 has a range of about 4 to about 70.

Figure 7:
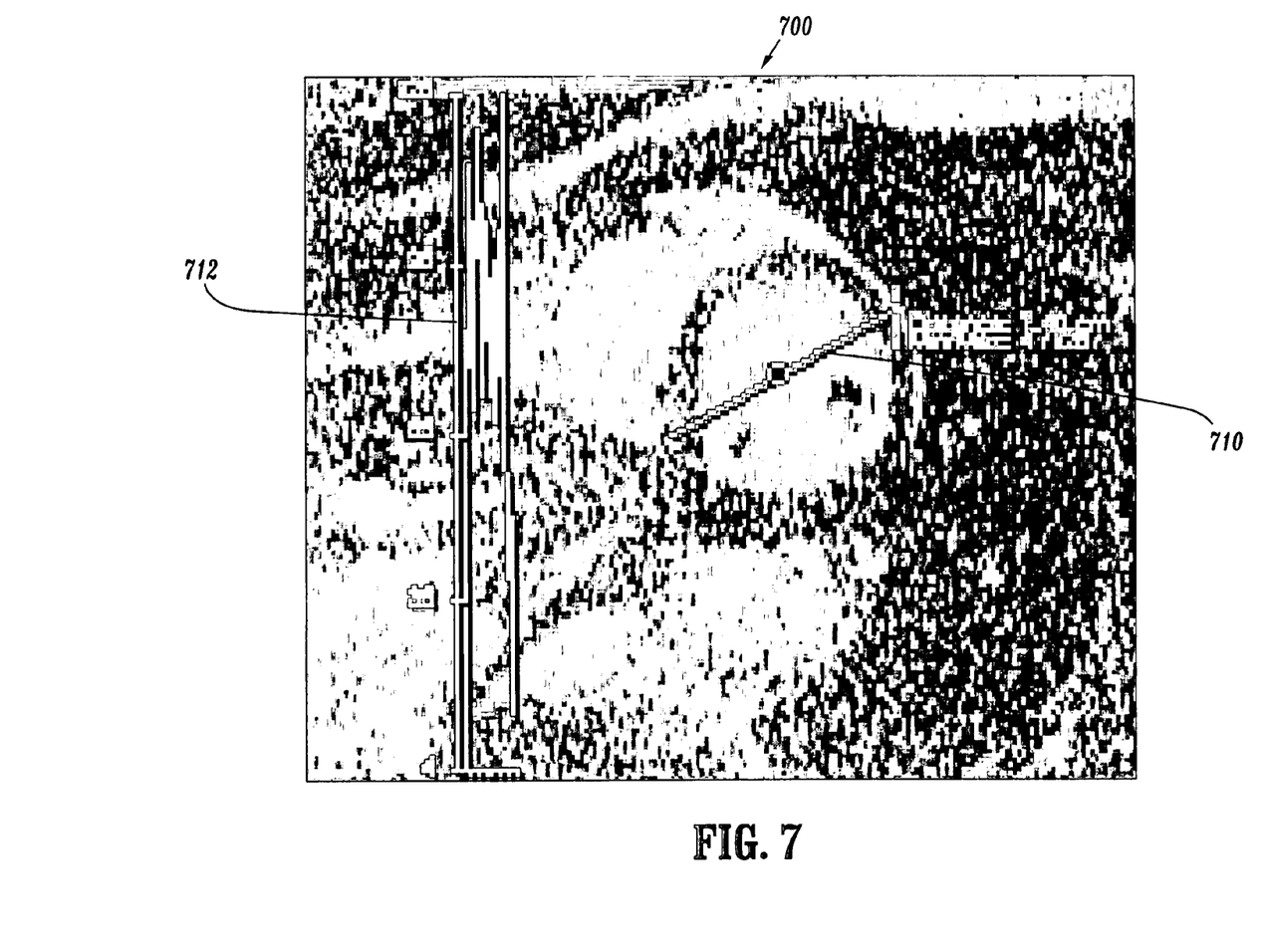
FIG. 7 shows a graphical diagram of an individual surface coil image in accordance with an illustrative embodiment of the present disclosure.

As shown in FIG. 7, an individual image constructed from a small surface coil is indicated generally by the reference numeral 700. The image 700 includes an intensity path 710, here having a length of about 7.40 centimeters, which has an intensity profile 712 that is displayed here over the image merely for descriptive purposes. The instant intensity profile 712 has a range of about 4 to about 128.

Figure 8:
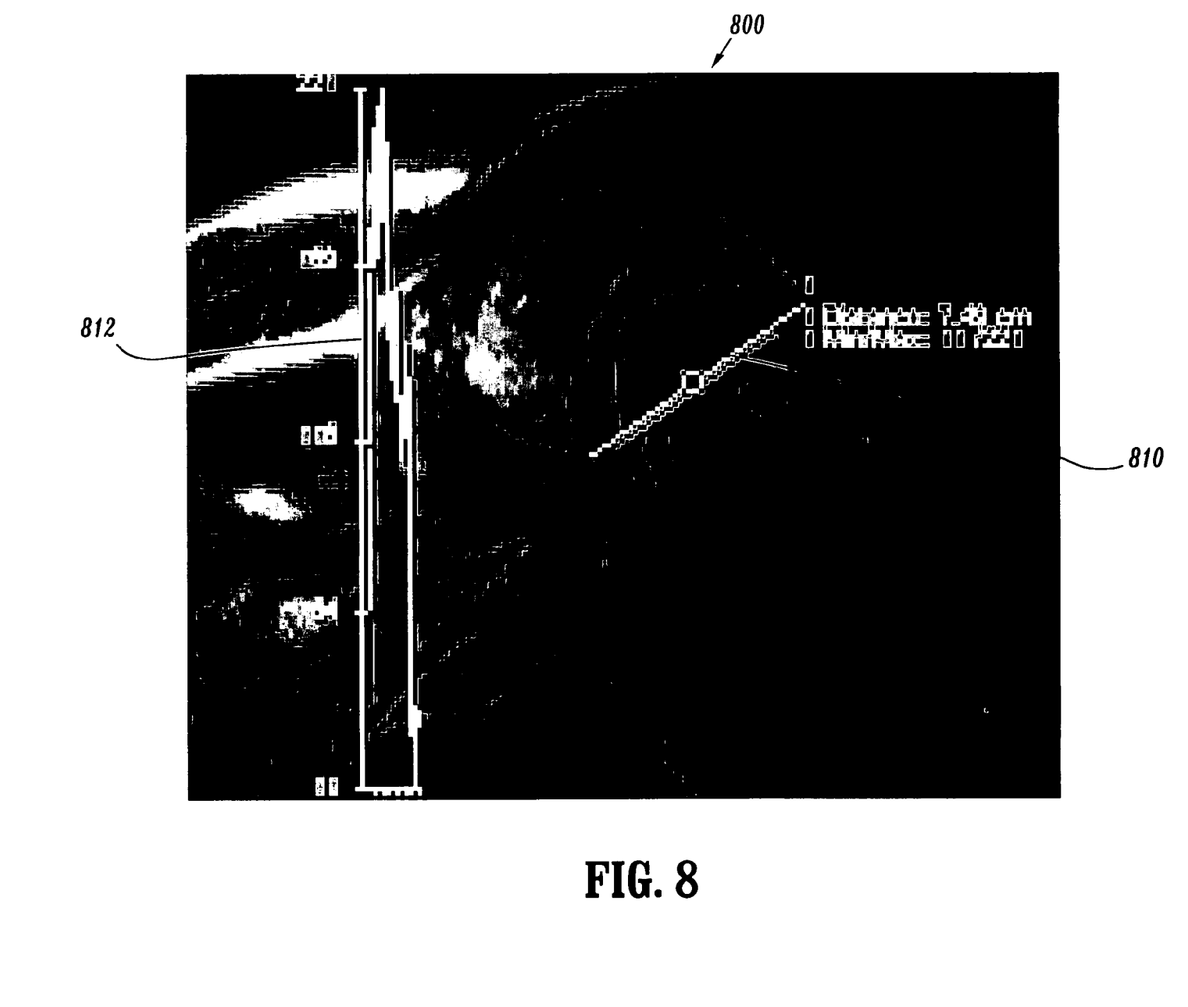
FIG. 8 shows a graphical diagram of an individual surface coil image in accordance with an illustrative embodiment of the present disclosure.

Turning to FIG. 8, an individual image constructed from a small surface coil is indicated generally by the reference numeral 800. The image 800 includes an intensity path 810, here having a length of about 7.49 centimeters, which has an intensity profile 812 that is displayed here over the image merely for descriptive purposes. The instant intensity profile 812 has a range of about 11 to about 221.

Figure 9:
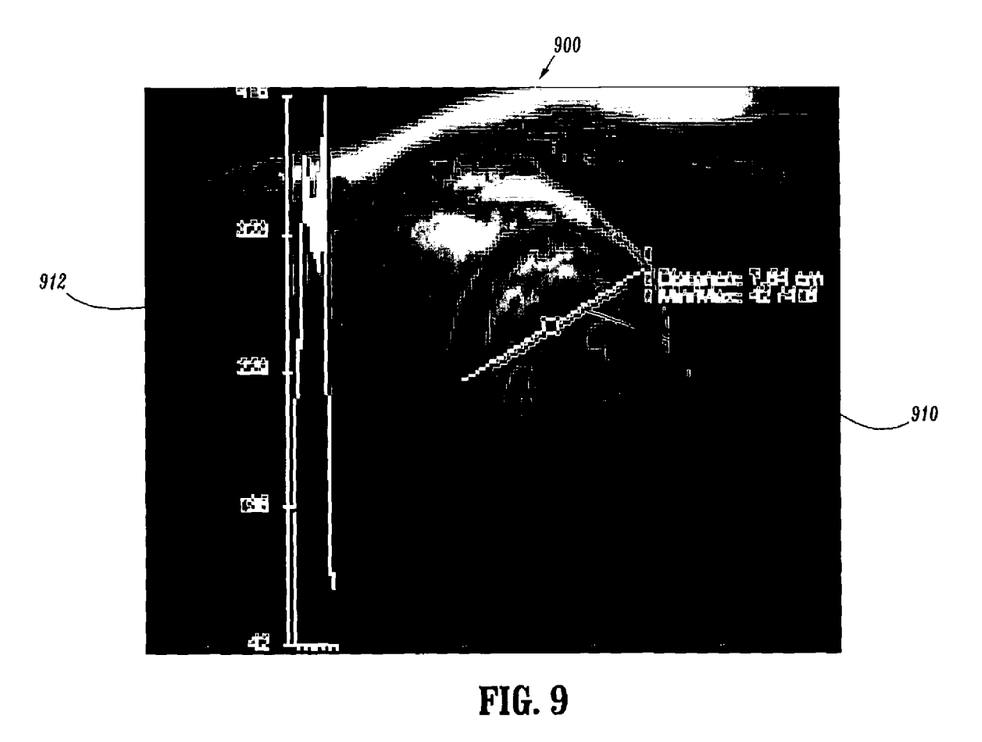
FIG. 9 shows a graphical diagram of an individual surface coil image of relatively high contrast in accordance with an illustrative embodiment of the present disclosure.

Turning now to FIG. 9, an individual image of relatively high contrast constructed from a small surface coil is indicated generally by the reference numeral 900. The image 900 includes an intensity path 910, here having a length of about 7.64 centimeters, which has an intensity profile 912 that is displayed here over the image merely for descriptive purposes. The instant intensity profile 912 has a range of about 42 to about 418.

Figure 10:
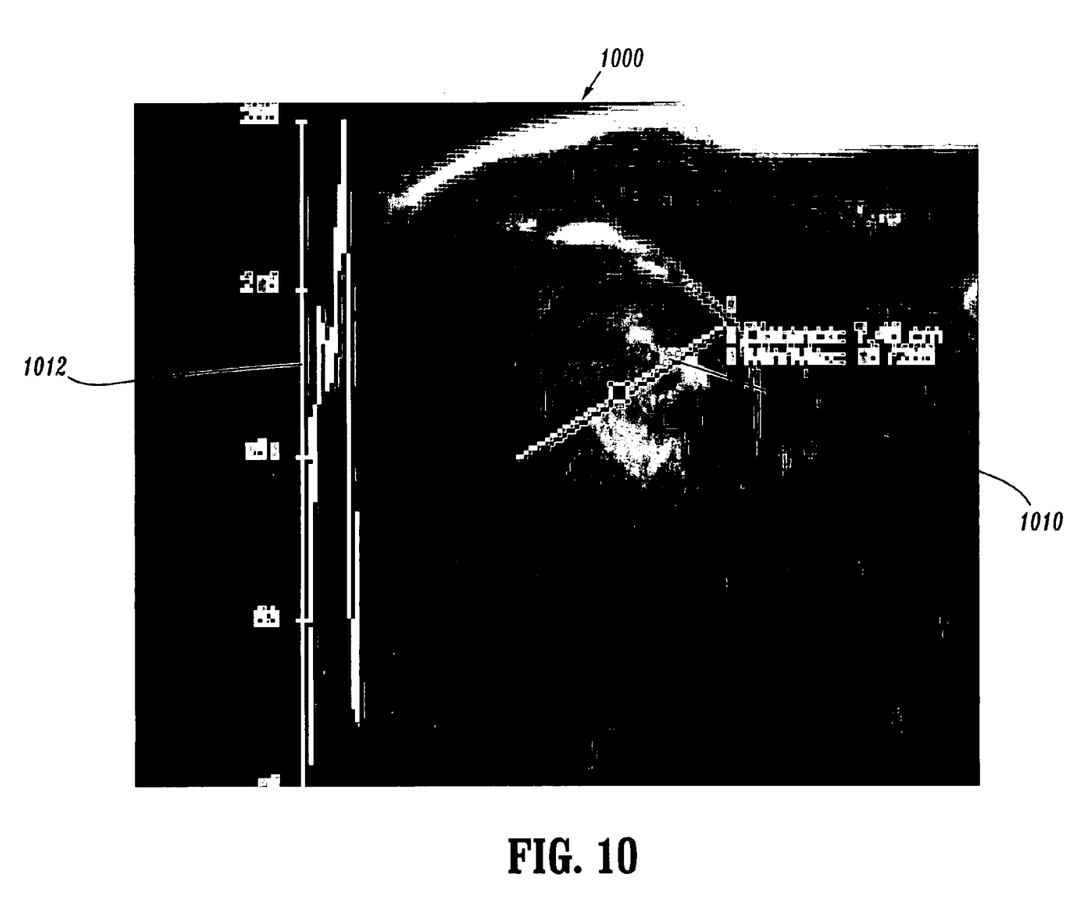
FIG. 10 shows a graphical diagram of an individual surface coil image in accordance with an illustrative embodiment of the present disclosure.

As shown in FIG. 10, an individual image constructed from a small surface coil is indicated generally by the reference numeral 1000. The image 1000 includes an intensity path 1010, here having a length of about 7.48 centimeters, which has an intensity profile 1012 that is displayed here over the image merely for descriptive purposes. The instant intensity profile 1012 has a range of about 16 to about 285.

In the images 300 through 1000 of FIGS. 3 through 10, respectively, the individual images reconstructed from small surface coils are shown, which may be used for partial parallel imaging, as well as the image intensity profiles across each image. The profile across the heart for each case is different in each image. However, some features of the profile of the heart region are consistent, and these consistencies can be used to define tissue borders, for example. Even the individual images of relatively lower contrast contribute useful information.

The spatial variations may be used as profiles or two-dimensional (2D) maps of signal intensity, and input to a segmentation or registration process to give additional information not present in a single image. Since the locations of the coils are known with respect to the underlying anatomy, the coil position and lack or presence of a signal variation also provides useful information. Registration of time series of images or different sub-modalities of MR images may also be attained using the additional information. Alternate applications include automatic coil selection based on analysis of noise and signal profile contents of each image, and providing input to reconstruction methods for partial parallel imaging.

In operation, images formed from various coil elements are spatially registered, and these inherently provide varied contrast to serve as input for a segmentation and/or registration step. The preprocessing of the data from individual coil elements may be done as part of the image reconstruction, thus making it rapid and efficient. Analysis of time-series of data from the individual coil elements may be used as input for registration and/or segmentation processing. Image data may be used to enhance the reconstruction of data. Alternate embodiments may include varying contrast in the set of individual coil images for additional input information.

Thus, preferred embodiments use data in a pre-final-image reconstruction mode, in accordance with coil-dependent varying signals, as a basis for segmentation, registration, coil selection and/or image reconstruction. In addition, raw data of the individual coil images is used as a basis for segmentation and/or registration.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

Most preferably, the teachings of the present disclosure are implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more central processing units (CPU), a random access memory (RAM), and input/output (I/O) interfaces.

The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure.

Although the illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method of multicoil image analysis comprising:
   receiving image data from each of a plurality of individual coils;
   analyzing the individual coil image data; and
   reconstructing at least one of a composite image and a plurality of individual coil images from the individual coil image data,
   wherein the image data received from at least one of the plurality of individual coils has a varied contrast relative to overlapping image data received from at least another of the plurality of individual coils.

2. A method as defined in claim 1, analyzing comprising profiling the intensities of the individual coil images.

3. A method as defined in claim 1, further comprising registering the reconstructed composite image with at least one other image in response to the analysis.

4. A method as defined in claim 1, further comprising segmenting the reconstructed composite image in response to the analysis.

5. A method as defined in claim 1 wherein the reconstructed image is indicative of an organ.

6. A method as defined in claim 5, further comprising segmenting the outer surface of the organ in response to the analysis.

7. A method as defined in claim 5, further comprising unfolding a three-dimensional (3D) model of the organ into a two-dimensional (2D) image.

8. A method as defined in claim 1 wherein user interaction is not required.

9. An apparatus for multicoil image analysis comprising:
   imaging means for receiving image data from each of a plurality of individual coils;
   analysis means for analyzing the received individual coil image data; and
   reconstruction means for reconstructing at least one of a composite image and a plurality of individual coil images from the individual coil image data,
   wherein the image data received from at least one of the plurality of individual coils has a varied contrast relative to overlapping image data received from at least another of the plurality of individual coils.

10. An apparatus as defined in claim 9 wherein the images are indicative of an organ, the apparatus further comprising display means for displaying organ image data.

11. A system for multicoil image analysis, comprising:
   a processor;
   an imaging adapter in signal communication with the processor for receiving image data from each of a plurality of individual coils;
   an analysis unit in signal communication with the processor for analyzing the individual coil image data; and a reconstruction unit in signal communication with the processor for reconstructing at least one of a composite image and a plurality of individual coil images from the individual coil image data, wherein the image data received from at least one of the plurality of individual coils has a varied contrast relative to overlapping image data received from at least another of the plurality of individual coils.

12. A system as defined in claim 11 wherein the processor renders the image data as a 2D image about a region of interest in response to the analysis.

13. A system as defined in claim 12, further comprising a display adapter in signal communication with the processor for displaying the rendered 2D image.

14. A system as defined in claim 13, further comprising a user interface adapter for checking the image quality.

15. A system as defined in claim 11 wherein the image is indicative of an organ.

16. A program storage device readable by machine, tangibly embodying a program of instructions executable by the machine to perform program steps for multicoil image analysis, the program steps comprising:

receiving image data from each of a plurality of individual coils;

analyzing the individual coil image data; and reconstructing at least one of a composite image and a plurality of individual coil images from the individual coil image data, wherein the image data received from at least one of the plurality of individual coils has a varied contrast relative to overlapping image data received from at least another of the plurality of individual coils.

17. A device as defined in claim 16, the program steps further comprising registering the reconstructed composite image with at least one other image in response to the analysis.

18. A device as defined in claim 16, the program steps further comprising segmenting the reconstructed composite image in response to the analysis.

19. A device as defined in claim 16 wherein the reconstructed image is indicative of an organ.

20. A device as defined in claim 16 wherein the reconstructed image is indicative of a beating heart.

* * * * *